United States Patent

Yoneda

[15] 3,657,611

[45] Apr. 18, 1972

[54] A SEMICONDUCTOR DEVICE HAVING A BODY OF SEMICONDUCTOR MATERIAL JOINED TO A SUPPORT PLATE BY A LAYER OF MALLEABLE METAL

[72] Inventor: Yoshitada Yoneda, Itami, Japan

[73] Assignee: Mitsubishi Denki Kabushiki Kaisha, Tokyo, Japan

[22] Filed: Aug. 21, 1970

[21] Appl. No.: 65,986

[30] Foreign Application Priority Data

Aug. 25, 1969 Japan ..................................44/67074

[52] U.S. Cl.......................317/234 R, 317/234 J, 317/234 L, 317/234 M, 29/589

[51] Int. Cl...........................................H01l 3/00, H01l 5/00

[58] Field of Search ...................317/234, 235, 235 A, 235 J, 317/235 L, 235 M, 235 N, 235 P; 29/582–589

[56] References Cited

UNITED STATES PATENTS

| | | | |
|---|---|---|---|
| 3,221,219 | 11/1965 | Emeis et al. | 317/234 |
| 3,293,509 | 12/1966 | Emeis | 317/234 |
| 3,476,986 | 11/1969 | Tsuji | 317/234 |

*Primary Examiner*—John W. Huckert
*Assistant Examiner*—Andrew J. James
*Attorney*—F. Shapoe and C. L. Menzemer

[57] ABSTRACT

This disclosure relates to a semiconductor device comprising a wafer of semiconductor material with ohmic contacts affixed to opposed parallel major surfaces of the wafer. The device is bonded to a metal support block along at least one of the major surfaces of the wafer.

5 Claims, 4 Drawing Figures

A SEMICONDUCTOR DEVICE HAVING A BODY OF SEMICONDUCTOR MATERIAL JOINED TO A SUPPORT PLATE BY A LAYER OF MALLEABLE METAL

BACKGROUND OF THE INVENTION

1. Field of the Invention

This invention is in the field of power semiconductor devices and relates particularly to wafers bonded to metal support plates.

2. Description of the Prior Art

Semiconductive wafers consisting of for example, silicon or germanium, are low in mechanical strength and fragile, and it is common practice to bond such wafers to supporting plates for rigidity by various brazing techniques. The bonding of the supporting plate to the semiconductive wafer can be accomplished by sandwiching a brazing material therebetween and heating the sandwich thus prepared to a temperature higher than the melting point of the brazing material to melt it.

Aluminum and its various alloys are often used as the brazing materials. With aluminum as the brazing material, it is required to heat the aluminum to a high temperature of the order of 600° C. to melt it. Such a relatively high temperature can cause a thermal stress to be developed in the wafer of semiconductor material.

It is known that the thermal stress is developed due to a difference in coefficient of thermal expansion between the material of the wafer and the material of the supporting plate and has a magnitude dependent upon the brazing temperature, the type of material and shape of the supporting plate, the type of material and thickness of the brazing layer involved. An increase in brazing temperature results in an increase in magnitude of thermal stress.

It has been confirmed that an increase in thermal stress developed in the semiconductive wafer causes, the addition to the occurrence of cracks in the semiconductive wafer, the deterioration of the electric characteristics such as a decrease in withstandable voltage, an increase in leakage current and the like for the resulting device although the wafer does not actually crack. Further any difference in coefficient of thermal expansion between materials of the semiconductive wafer and the associated supporting plate can cause a bending of the bonded wafer and plate resembling that of a bimetal.

In the case where one electrode is put in compression contact between a semiconductive wafer and a support plate to such bending can adversely affect the contacting of the electrode with the associated wafer or plate which, in turn, gives rise to increase in electric and thermal resistances between the contacting portions thereof as well as decreasing the ability of the structure to withstand an overcurrent.

Lately, as the current and voltage capability of semiconductor devices have been increased by increasing the size of the wafer. Semiconductive wafers have been produced having a diameter of from 40 to 50 mm for example. For such large-sized wafers thermal stress is even more critical. Thus it is very desirable to decrease the thermal stress applied to semiconductive wafers.

In addition, cavities are apt to be formed in a layer of brazing material and it is difficult to avoid the formation of such cavities particularly when a large-sized semiconductive wafer is brazed to the associated supporting plate with a large contact area. In other words, it is difficult to effect a reliable brazing throughout a surface to be brazed. Therefore the resulting brazed surface leads to an increase in electric and thermal resistances.

SUMMARY OF THE INVENTION

In accordance with the present invention there is provided a semiconductor device comprising, a wafer of semiconductor material, said wafer containing at least one p-n junction, an electrical contact affixed to a major surface of said wafer, a support plate, a layer of a malleable metal disposed between said major surface of the wafer and the support plate and bonding the wafer to the support plate.

The layer of malleable metal consists of a metal selected from the group consisting of gold, silver, lead, silver-lead alloys, tin, tin-silver alloys and cadmium.

The support plate consists of a metal whose coefficient of thermal expansion approximates that of the semiconductor material of the wafer.

The present invention also provides a process for preparing a semiconductor device comprising the steps; applying a first layer of a malleable metal to a major surface of a wafer of a semiconductor material, applying a second layer of a malleable metal to a major surface of a support plate, and contacting the first and second malleable layers under pressure while heating the assembly to a temperature below the melting point of either of the two layers, whereby the wafer is bonded to the plate.

Preferably, the first and second malleable metallic layers may be contacted by each other under a pressure of from 1.5 to 2.2 kg. $mm^2$ and heated to a temperature of from 150° to 300° C. under such a pressure.

BRIEF DESCRIPTION OF THE DRAWINGS

The invention will become more readily apparent from the following detailed description taken in conjunction with the accompanying drawing, in which.

DESCRIPTION OF THE PREFERRED EMBODIMENT

Figure 1:
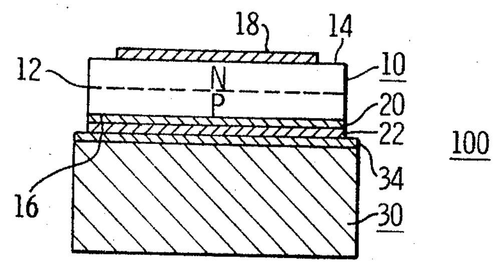
FIG. 1 is a sectional view of a semiconductor device constructed in accordance with the invention.

In FIG. 1, a semiconductor element is generally designated by the reference numeral 100 and comprises a wafer 10 of any suitable semiconductive material for example silicon and a supporting plate or block 30. Only for purpose of illustration, it will be assumed that the wafer 10 consists of silicon and has only one P-N junction 12 therein. However, it is to be understood that the wafer 10 may be formed of germanium or any other semiconductive material and may be a power transistor or a thyristor and contain two, three or more junctions. For power transistors, the element 10 includes two P-N junctions (not shown) therein and for thyristors, it includes three or four P-N junctions (not shown) therein. The P-N junction 12 can be formed in the semiconductor wafer 10 by diffusing an N type impurity thereinto from one surface for a substrate of P type silicon and by diffusing a P type impurity thereinto from one surface for a substrate of N type silicon.

As shown in FIG. 1, the wafer 10 includes the P-N junction 12 defined by an N type and a P type region and a pair of opposite main faces 14 and 16 disposed in substantially parallel relationship. A pair of ohmic contact layers 18 and 20 are disposed on the upper and lower main faces 14 and 16 as viewed in FIG. 1 to be put in nonrectifying contact with the N and P type regions respectively. Both contact layers 18 and 20 may be formed on the respective main faces 14 and 16 by depositing any suitable metal such for example as nickel, aluminum, gold, silver and base alloys thereof on the main faces by evaporation or plating technique well known in the art.

According to the invention, a bonding layer 22 formed of a malleable metallic material is applied to the ohmic contact layer 20 to cover the entire surface thereof. To this end, any suitable malleable metallic material can be deposited on the ohmic contact layer 20 as by the well known evaporation or plating technique. Such a malleable metallic material should be high in electric conductivity and suitable examples thereof include, for example, gold, silver, lead, silver-lead alloys, tin, silver-tin alloys and cadmium. Evaporating or plating techniques, well known to those skilled in the art may be used to deposit any one of the malleable metallic materials specified on the ohmic contact layer 20 to a suitable thickness preferably of from 10 to 15 microns.

The layers 18, 20 and 22 may be sintered after deposition to prevent peeling off. Such sintering can be carried out at a temperature of at least 600° C. It is to be noted that such a temperature does not apply an excessively high thermal stress on the wafer 10 since the layers 18, 20 and 22 are very thin as compared with the wafer 10 which normally has a thickness of at least 200 to 300 microns, while layers 18, 20 and 22 will normally have a thickness which may range from 10 to 20 microns. Under such circumstances a thermal stress due to any difference in coefficient of thermal expansion between the materials for the layers 18, 20 and 22 and the wafer 10 will be absorbed by the thin layers 18, 20 and 22.

Figure 2:
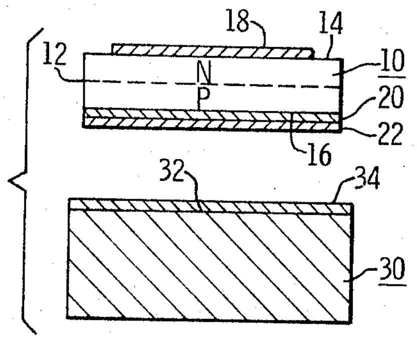
FIG. 2 is an exploded sectional view of the device illustrated in FIG. 1.

In this way, the contact and bonding layers 18, 20 and 22 respectively have been rigidly attached to the wafer 10 which is illustrated in FIG. 2.

In order to reinforce the wafer 10 of semiconductor material, which is fragile by nature, there is separately prepared a supporting block or plate therefor generally designated by the reference numeral 30 in FIG. 1. The supporting plate 30 is preferably formed of a material approximating in coefficient of thermal expansion the semiconductor material of the wafer 10. If the wafer 10 is of either silicon or germanium the supporting plate 30 is preferably comprised of a metal or alloy selected from the group consisting of molybdenum, tungsten, tantalum, base alloys thereof, and silver-tungsten alloys. The supporting plate 30 has two opposed main faces or surfaces at least one of which, in this case, the upper main face 32 as viewed in FIG. 1 is, lapped into a flat smooth surface on which the wafer 10 is supported and bonded.

As in the wafer 10, a bonding layer 34, similar to the bonding layer 22, is applied to the upper main face 32 of the supporting plate 30 as by the evaporation or plating technique well known in the art. The bonding layer 34 should be formed of a malleable metallic material similar to that for the layer 22. It has been found that the bonding layer 34 is preferably of the same material as the bonding layer 22. If the layers are formed of dissimilar materials, there is the possibility that the bonded portion of the layers will increase the thermal end electric resistances as a result of a disturbance of the atomic arrangement in the bonded portion. If desired, the bonding layer 34 may be sintered. In FIG. 2 the supporting plate 30 is illustrated on the lower portion after it has been processed as described above.

The wafer 10 and the supporting plate 30 are then connected together into the semiconductor element 100 of unitary structure. The wafer 10 superposes the supporting plate 34 with both bonding layers 22 and 34 brought into contact under a suitable pressure followed by heating at a relatively low temperature. It has been found that a pressure ranging from 1.5 to 2.2 kg/mm$^2$ applied across the bonding layers 22 and 24 will produce satisfactory results. In order to apply and maintain a suitable pressure across the layers 22 and 34, spring loaded pressure holding means of the conventional construction may be used to apply and maintain the pressure across the upper contact layer 18 on the wafer 10 and that face not provided with a bonding layer, that is, the lower face as viewed in FIG. 1 or 2 of the supporting plate 30.

While the production of a single semiconductor element 100 has been described, it will readily be understood that a plurality of semiconductor elements may be simultaneously produced in the similar manner. A plurality of semiconductive wafers and supporting plates such as shown in FIG. 2 are separately produced. Then the wafers and the supporting plates superposed on each other in pairs in the manner described above, after which the superposed wafer and plates are joined by the application of a suitable pressure by any desired means.

A single or plural pair of the wafer and supporting plate maintained in pressure contact relationship are placed in any suitable furnace and heated to a temperature dependent upon the type of material employed and the thickness of the contact area of each layer 22 or 34 and for a period of time also dependent upon the factors just described. It is to be noted that the heating temperature should be considerably lower than the melting point or points of the material or materials for both bonding layers 22 and 34. Further that heating is preferably effected in an atmosphere of inert gas.

It is well known that gold, silver, lead, tin and cadmium are melted at 1063°, 960°, 327°, 231° and 320° C. respectively. Also silver-lead alloys have their melting points intermediate the melting points of their ingredients as to silver-tin alloys. Therefore the heating temperature employed preferably ranges from 150° to 300° C. if gold or silver form the layers 22 and 34, from 150° to 250° C. if silver-lead alloys, silver-tin alloy, lead or cadmium form the layers 22 and 24 and from 150° to 200° C. if the layers are of tin. Generally speaking, therefore, a heating temperature suitable for practicing the invention ranges from 150° to 300° C.

There is found the phenomenon that if two bodies of similar or dissimilar malleable metals are brought into contact with each other under a pressure of from 1.5 to 2.2 kg/mm$^2$ and heated at a temperature less than the melting point or points thereof but in the range of from 100° to 300° C. for several hours that both bodies are softened until they are bonded to each other. The bonding of the layers 22 and 34 is accomplished through this phenomenon. Thus the wafer and the supporting plate are interconnected into a semiconductor element of unitary structure such as shown in FIG. 1.

The semiconductor elements thus produced can be incorporated into various types of semiconductor devices. The semiconductor element 100 shown in FIG. 1. is particularly suitable for use in the compression supporting type of semiconductor devices wherein the semiconductor element is hermetically enclosed by an enclosure such that the wafer and the supporting plate have applied thereacross a pressure in a direction to compression contact them with each other. The pressure ensures that the wafer is effectively bonded to the supporting plate.

As above described, the bonding of the malleable metallic layers 22 and 34 is accomplished by heating to a temperature less than the melting point or points thereof. This measure is effective for decreasing a thermal stress developed in the material for the wafer 10 during the heating operation. If the bonding is effected at a higher temperature, a higher thermal stress is applied to the wafer 10 due to the fact that the thermal stress applied to the semiconductor element 10 due to any difference in coefficient of thermal expansion between the wafer and support plate is directly exerted upon the wafer but scarcely absorbed by the supporting plate 30 because of the plate being high in mechanical strength. On the other hand, the bonding of the layers 22 and 34 at a low temperature causes a decrease in a difference in magnitude of thermal expansion between the wafer 10 and the supporting plate 30 and therefore in the corresponding thermal stress applied to the wafer.

Further, the use of a bonding temperature lower than the melting point or points of the malleable metallic material or materials permits the layers 22 and 34 to be bonded to each other without melting thereof. This ensures that the layers 22 and 34 are uniformly bonded to each other throughout the entire bonding surface. If those layers are bonded to each other by melting their material or materials then cavities can and often do occur in the particular bonded portion as in brazing techniques.

The invention also has other advantages. Semiconductive wafers such as the wafer 10 are generally subject to surface treatment before they are assembled into the associated semiconductor devices, for the purpose of increasing their ability to withstand a voltage. Such surface treatment consists of tapering the peripheral surface of the wafer extending between the opposed main surfaces of the wafer with respect to the plane of the P-N junction disposed in the wafer. The tapered surface is then normally coated with a passivating material such as for example silicon oxide-dioxide and silicon nitride. If the peripheral wafer surface is exposed to a high temperature the passivating material may be deteriorated necessitating the recoating of the wafer. Therefore if the step of bonding the wafer to the associated supporting plate is accompanied by the use of high temperature then the wafer must be bonded to the plate prior to the surface treatment as above described. When doing so, a heavy metal or metals from the supporting plate can be dissolved into the particular etching solution and then attached to the surface of the water not coated with the passivating material. This results in the deterioration of the electric characteristics of the wafer.

On the other hand, the use of low bonding temperature according to the invention permits the bonding step to be effected after the surface treatment. That is, the wafer with the passivating material can be bonded to the supporting plate without deteriorating the electrical properties of the passivating material.

If the particular wafer is very thin, it is difficult to handle the wafer alone leading to the difficulty with which only the wafer is subject to the surface treatment as above described. However, for wafers as thick as about 1 mm, it is possible to subject the wafers to the surface treatment while they are physically separated from the corresponding supporting plates.

Figure 3:
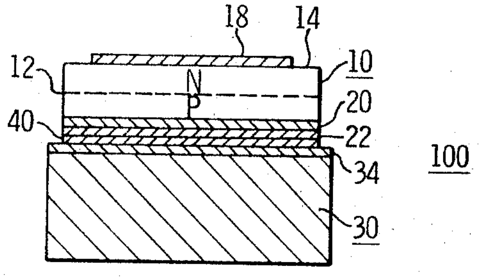
FIG. 3 is a sectional view of another form of a semiconductor device constructed in accordance with the invention.
Figure 4:
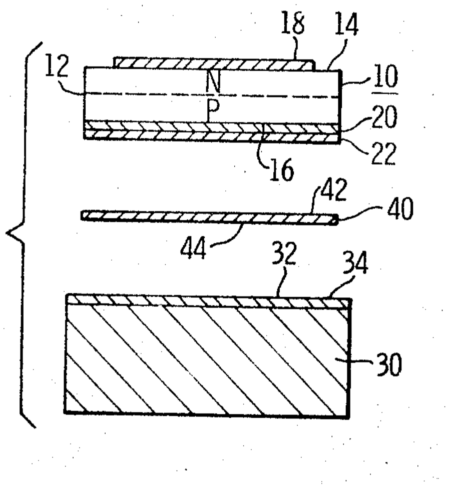
FIG. 4 is an exploded sectional view of the device illustrated in FIG. 3.

FIGS. 3 and 4 wherein like reference numerals designate the components identical to those shown in FIGS. 1 and 2, illustrates a modification of the invention. The arrangement illustrated is different from that shown in FIG. 1 only in that a bonding sheet 40 of malleable metallic material is interposed between the layers 22 and 34. The bonding plate 40 is preferably formed of the same material as the layers 22 and 34 and serves to further decrease the thermal and electric resistances presented by the bonded portion of the layers 22 and 34 and the sheet 40.

As shown in FIG. 4, the bonding sheet 40 has a pair of opposite main faces 42 and 44 disposed in substantially parallel relationship. The sheet 40 is sandwiched between the wafer 10 and the supporting plate 30 such as previously described in conjunction with FIG. 1 and with the main faces 42 and 44 contacted by the layers 22 and 34 respectively. Then the wafer 10, the layer 40 and the supporting plate 30 are interconnected into a unitary structure in the same manner as previously described conjunction with FIGS. 1 and 2. The presence of the bonding plate 40 permits the thicknesses of the layers 22 and 34 to further decrease thereby to reduce thermal stresses applied to the wafer 10 and the supporting plate 34 from the layers 22 and 34.

I claim as my invention:

1. A semiconductor device comprising a wafer of semiconductor material, said wafer containing at least one P-N junction, an electrical contact affixed to a major surface of said wafer, a support plate, a layer of a malleable metal disposed between said major surface of the wafer and the support plate, said layer comprising a first layer bonded to the wafer and a second layer bonded to the support plate, the first and second layers being bonded to each other without a melted joint therebetween whereby the wafer is bonded to the support plate.

2. The device of claim 1 in which the support plate consists of a metal whose coefficient of thermal expansion approximates that of the wafer.

3. The device of claim 1 in which the wafer consists of silicon and the support plate consists of a metal selected from the group consisting of molybdenum, tungsten, tantalum, base alloys thereof and silver base tungsten alloys.

4. The device of claim 3 in which the electrical contact consists of a metal selected from the group consisting of nickel, aluminum, gold, silver and base alloys thereof.

5. The device of claim 4 in which malleable metal layer consists of a metal selected from the group consisting of gold, silver, lead, silver-lead alloys, tin, silver tin alloys and cadmium.

* * * * *